United States Patent [19]
Pierce

[11] 4,417,099
[45] Nov. 22, 1983

[54] ELECTRO-OPTICAL ISOLATOR CIRCUIT FOR LINE POWERED MODEM

[75] Inventor: O. Leon Pierce, Huntsville, Ala.

[73] Assignee: Universal Data Systems, Inc., Huntsville, Ala.

[21] Appl. No.: 203,110

[22] Filed: Nov. 3, 1980

[51] Int. Cl.³ .............................................. H03K 3/42
[52] U.S. Cl. ................................ 179/2 DP; 307/311; 375/8
[58] Field of Search ................ 323/902; 307/311, 315; 179/2 DP, 2 C, 1 C; 375/8

[56] References Cited
U.S. PATENT DOCUMENTS

| | | | |
|---|---|---|---|
| 3,539,727 | 11/1970 | Pasternack | 179/2 DP |
| 4,024,501 | 5/1977 | Herring et al. | 375/36 X |
| 4,262,220 | 4/1981 | Delucruz | 307/311 |

OTHER PUBLICATIONS

The Bell System Data Set Catalog; 1972; pp. 2-56.
The Bell Systems Data Set 113A Product Literature–Description and Operation, pp. 1-6; Installation and Connection, pp. 1-7, and Test Procedure, pp. 1-4; 1972.

*Primary Examiner*—G. Z. Rubinson
*Assistant Examiner*—James L. Dwyer
*Attorney, Agent, or Firm*—Weingarten, Schurgin, Gagnebin & Hayes

[57] ABSTRACT

An electro-optical isolator circuit especially adapted for operation in a modem which is powered solely from the telephone line and employed to isolate the line from utilization equipment. The isolator includes a guard circuit which substantially improves low current operating speed such that an inexpensive electro-optical component can be utilized at very low drive levels to achieve response times less than 10 microseconds.

3 Claims, 2 Drawing Figures

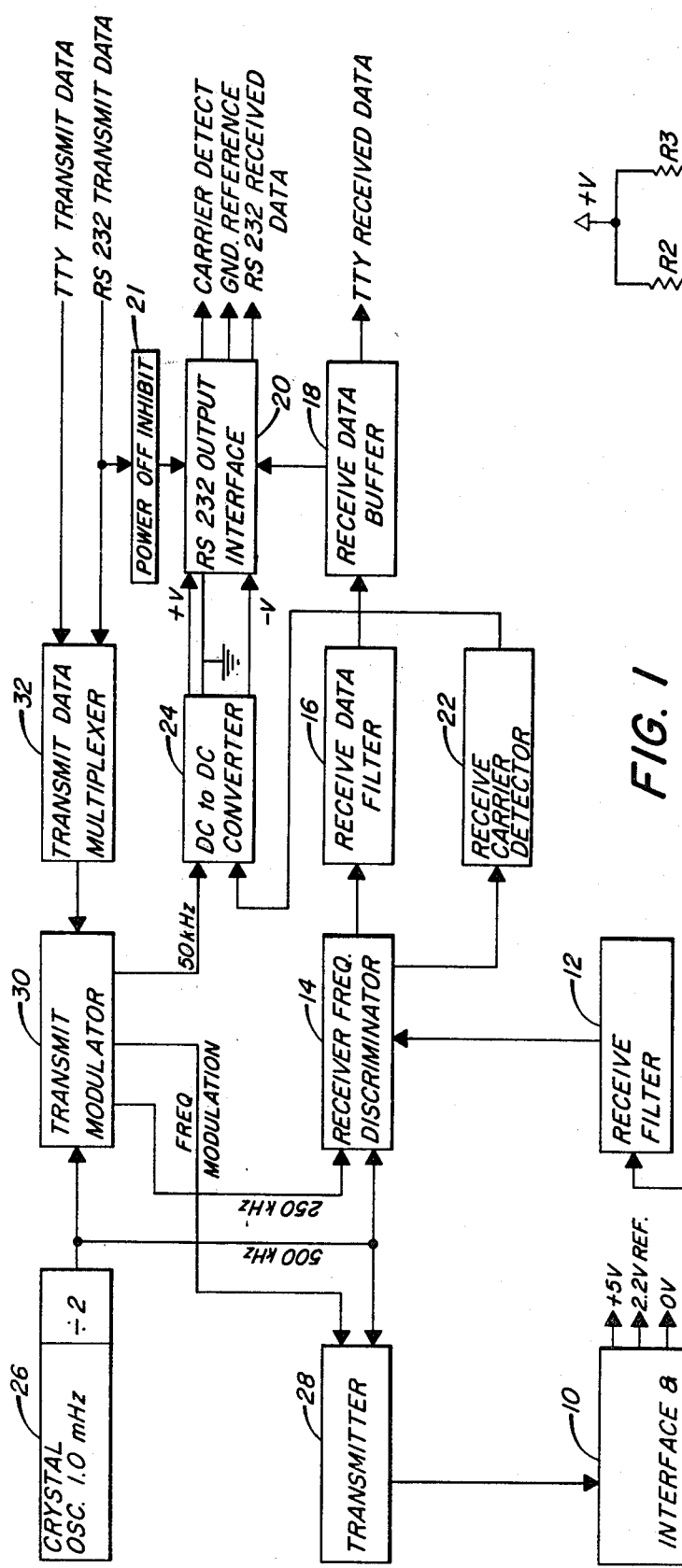
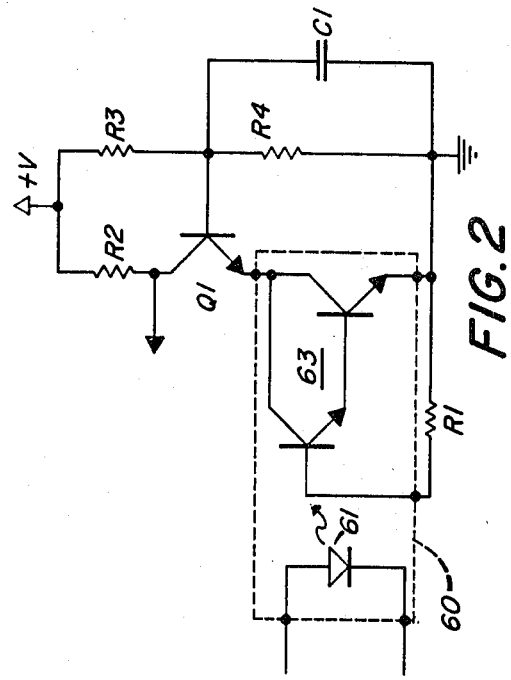
FIG. 1
FIG. 2

ELECTRO-OPTICAL ISOLATOR CIRCUIT FOR LINE POWERED MODEM

FIELD OF THE INVENTION

This invention relates to data modems for coupling data to and from a telephone line, and more particularly to an electro-optical isolator circuit operative in a modem which is powered solely from the telephone line and employed to isolate the telephone line from utilization equipment.

BACKGROUND OF THE INVENTION

A modem is disclosed in copending application of O. Leon Pierce, Mark C. Smith, and R. Byron Driver, entitled Line Powered Modem, Ser. No. 203,108, now U.S. Pat. No. 4,395,590, filed contemporaneously herewith, and assigned to the same assignee as this invention, in which the entire operating power for the modem circuits is derived from the available telephone line power. This modem includes an RS232 output interface circuit which provides a carrier detect signal and a received data signal which must be within predetermined voltage ranges to be properly received by the associated business machine or other utilization apparatus to which the modem is connected. This output interface circuit must be appropriately powered to provide the intended output signal levels.

In the aforesaid line-powered modem, electro-optical isolators are provided to isolate the telephone line from the utilization equipment. Such isolators include an LED which provides light signals in response to applied electrical signals, and a photodetector providing a corresponding electrical output signal in response to received light signals from the LED. Electro-optical isolators are generally known for providing isolation between input and output circuits. However, isolators of known construction have a relatively slow speed of response to low current signals. As a result, current levels must be sufficiently high to provide adequate response speed. The utility of such conventional isolators in a line-powered modem is materially impaired, since in line-powered modems, only low current levels are available and an increased speed of response cannot be achieved by increasing the current drive to the isolator LED.

The relatively slow response time of the isolator is caused by presence of stored charge in the phototransistor which must be allowed to bleed off in order to turn the transistor off. If the only path for dissipation is through the high-impedance base-emitter junction of the phototransistor, the process can take hundreds of microseconds before sufficient charge is dissipated to turn the transistor off. Moreover, the Miller effect capacitance, which is the collector-base capacitance of the phototransistor, causes, in response to large changes in voltage at the collector, a current to flow through that spurious capacitance to the base which opposes the turn-off operation.

SUMMARY OF THE INVENTION

In brief, the present invention provides an improved electro-optical isolator especially adapted for use in a line-powered modem and having increased speed of response at low current levels. The isolator comprises an LED in light coupled relationship with a phototransistor and a guard circuit operative to limit the voltage change at the output of the phototransistor during turn on and turn off such that rapid response times are achieved at low current levels. Typically, response times less than 10 microseconds can be achieved with LED drive levels of 1-2 milliamperes.

DESCRIPTION OF THE DRAWINGS

The invention will be more fully understood from the following detailed description taken in conjunction with the accompanying drawings, in which:

FIG. 1 is a block diagram of a preferred embodiment of a line-powered modem in accordance with the invention; and FIG. 2 is a schematic diagram of an electro-optical isolator in accordance with the invention.

DETAILED DESCRIPTION OF THE INVENTION

A line powered modem embodying the present invention is shown in FIG. 1. In the illustrated embodiment the modem is a type 103 modem which provides full duplex operation at transmitting and receiving rates up to 300 bits per second (baud) and employing two level frequency shift keyed (FSK) modulation. Two carrier frequencies are employed, one for transmission at a center frequency of 1170 Hz and the other for reception at a center frequency of 2125 Hz. To minimize power consumption, the modem is constructed of CMOS digital integrated circuits which have inherently low current requirements. The CMOS circuits are also relatively inexpensive, thereby permitting economical construction. The modem employs digital signal processing including digital synthesis of the transmitted frequencies and digital discrimination of the received frequencies to achieve highly accurate frequency stability at low power levels and in a compact and relatively inexpensive manner.

The modem is connected to and fully powered by the telephone line, and is also connected to a data terminal, business machine or other apparatus to and from which data is transferred. The modem provides electrical isolation between the telephone line and the utilization apparatus. The telephone line is connected to a telephone line interface and power source 10 which provides operating power derived from the telephone line to all modem circuits. This interface circuit 10 also couples signals from the telephone line for demodulation by the modem, and signals from the modem to the telephone line for transmission. In order to hold the telephone line in an off hook condition, a current in the range of 20-150 milliamperes must be drawn. The minimum load requirements for the telephone line are specified to be 8 volts drop at 20 milliamperes. As a result, the telephone line can provide a minimum of 160 milliwatts of power to circuitry connected thereto. An input impedance of 600 ohms must also be maintained to accord with telephone specifications. The modem described herein has a minimum power requirement of 5 volts at 17 milliamperes, or 85 milliwatts. This very low power consumption is well within the 160 milliwatts limit of available power from the telephone line.

The telephone line has a specified nominal DC level of 48 volts and a DC equivalent series resistance (minimum source resistance) of 400 ohms. The actual DC current on a particular line will depend on the resistance of that particular line, which is a function of the length of the line from the central office power source. Typically, the equivalent line resistance can be from near zero to about 1200 ohms. For the illustrated type 103 modem, the interface and power source 10 provides a regulated 5 volt output with respect to a common terminal and a regulated 2.2 volt output with respect to the common terminal which is employed as a reference voltage in the modem. The 2.2 volt reference is employed in the shunt regulator of the power source and as a voltage bias for the receiver operation. The circuit 10 is also operative to couple audio data signals received on the telephone line to the modem receiver, and to couple data signals from the modem transmitter to the telephone line for transmission to a remote receiver.

The interface and power source 10 can be considered as a shunt regulator across the load and a current regulator in series with the load. The shunt regulator functions much like a Zener diode and provides a voltage level which is substantially constant irrespective of variations in applied current. The current regulator provides a low DC resistance of about 10–20 ohms, and provides an AC impedance which is relatively high such that audio variations in line voltage cause no appreciable current change through the load. This current regulator serves as an active electronic circuit equivalent to the large inductor which would normally be required to separate the audio signals from the DC telephone line current.

Referring to FIG. 1, received signals from the telephone line are coupled by interface and power source 10 to a receive filter 12 which is a bandpass filter operative to limit the received signal spectrum to the desired band which is usually specified to be approximately 350 Hz centered at a frequency of 2125 Hz. The filter 12 includes an amplifier to provide an amplified output signal which is applied to a receiver frequency discriminator 14. This frequency discriminator includes a digital phase lock loop and is operative to provide a digital signal having a duty cycle representing the frequency of the signal from filter 12. The variable duty cycle signal is applied to a receive data filter 16 which removes unwanted harmonics and averages the variable duty cycle input signal to produce an output which is a linearly varying voltage which is directly proportional to the frequency of the received signal.

This signal from the data filter 16 is applied to a receive data buffer 18 which provides as an output TTY (teletypewriter) received data. The data buffer 18 also provides an output signal to an RS232 output interface 20 which provides as an output RS232 received data and a carrier detect signal. The receive data buffer 18 includes a slicer circuit operative to determine whether the voltage corresponds to a frequency above or below the 2125 Hz center frequency of the receiver band. If the analog voltage denotes a frequency above 2125 Hz, the data buffer 18 provides a voltage output level at the mark state. If the voltage denotes a frequency below 2125 Hz, the data buffer 18 provides an output voltage level at the space state.

The received data is provided by way of electro-optical isolators which achieve complete electrical isolation between the modem and the associated utilization apparatus. The data buffer 18 includes two electro-optical isolators which are part of an output buffer. One isolator is employed to provide a current switched between two levels, depending upon the mark or space state of the received data, for TTY equipment. The other isolator is employed to provide an RS232 data output by way of interface 20. The output interface 20 also provides a carrier detect signal in the presence of a valid carrier being received. In the 103 modem two criteria are employed for determining the validity of a received carrier. If there is sufficient energy in the receiver band, the presence of that energy is assumed to be a carrier from the transmitting site. Normally the level of discrimination is of the order of −46 DBM. Thus, if the received signal energy exceeds −46 DBM, and the frequency of the received energy is within a band of about 400 Hz centered at 2150 Hz, it is recognized to be a valid carrier.

The frequency discriminator 14 includes a level detector operative to detect signals above a predetermined level, and also includes circuitry for sensing within a predetermined frequency band. Typically, the threshold level of the discriminator is about −45 DBM and the frequency range is about 1950–2350 Hz. For recognition of a valid carrier signal, the signal level must exceed the discriminator threshold level and be within the discriminator band. The discriminator 14 provides to the carrier detector 22 a signal of one binary level upon detection of a valid carrier, and of a second binary level if no carrier is present or does not meet the detection criteria. Thus, the carrier detector 22 receives a bilevel signal from the frequency discriminator 14 indicative of the presence or absence of a valid carrier, and provides an enable signal to DC to DC converter 24 in the presence of a valid carrier signal. The converter 24 is driven by an unbalanced 50 kHz square wave signal from transmit modulator 30. The 50 kHz unbalanced signal has a duty cycle of 60 percent positive and 40 percent negative cycles.

The DC to DC converter 24 is operative to convert the 5 volt power signal derived from the telephone line to the voltages used to drive the RS232 interface circuit 20 which provides the interface signals to be applied to the associated utilization apparatus. The converter furnishes the minimum power necessary to ensure that the interface signals are of sufficient signal level to be properly received by the business machine or other utilization apparatus. The voltages provided by the converter are offset in the positive direction, since most RS232 receivers have a positive threshold in the range of +0.5 to 1.0 volt. The interface circuit 20 provides the carrier detect output signal and the RS232 received data signal to be applied to the associated apparatus. The RS232 interface is specified to have a minimum voltage of +3 volts or −3 volts, depending on the state of the output, and a minimum load of 3 K ohms. This requires a minimum of about 1 milliampere of current.

Master timing is provided by a crystal oscillator and frequency divider circuit 26. The crystal oscillator is operative at 1 mHz and, after division, provides a 500 kHz clock signal to receiver frequency discriminator 14 and to transmitter 28 and modulator 30. A 1 mHz crystal is employed to implement the oscillator with available CMOS circuits operable at a voltage level of 5 volts for the intended signal rates. Since the maximum resolution required by the digital circuits is not more than 500 kHz, the 1 mHz crystal oscillator frequency is divided by a factor of two to provide a 500 kHz clock signal.

The transmitter frequency of 1170 Hz is digitally synthesized and provided by the transmitter 28. The FSK modulation is provided by transmit modulator 30. The TTY data or RS232 data to be transmitted is applied to a data multiplexer 32 which provides the data to modulator 30. The modulator is operative to frequency shift the transmitter carrier in a phase coherent manner to provide the FSK modulated signal which is applied via interface 10 to the telephone line for transmission to a compatible modem at the other end of the line. The modulator also provides a 50 kHz unbalanced square wave signal to drive the DC to DC converter. The modulator also provides a 250 kHz clock signal to the receiver frequency discriminator 14. The transmitter 28 includes a sinewave synthesizer, digital counters and digital-to-analog converter to generate an analog signal which after appropriate filtering is applied to the telephone line for transmission. The transmitted frequency is 1170 Hz±the frequency deviation caused by the mark or space states of the transmitted data.

Electro-optical isolators are employed to isolate the telephone line from the utilization equipment. Two isolators are provided in the transmit data multiplexer 32, one for TTY transmit data and the other for RS232 transmit data. Two isolators are also provided in the receive data buffer 18 for the TTY received data, and RS232 received data, respectively. The isolator circuits are substantially identical and each are as shown in FIG. 2. The electro-optical isolator 60 includes an LED 61 which provides light signals in response to applied electrical signals, and a phototransistor pair 63 providing a corresponding electrical output signal in response to received light signals from the LED. This isolator can be a commercial solid state microcircuit isolator such as an Optron OPI 3250. The isolator 60 has a relatively slow speed of response to the low available current levels. The circuit of FIG. 2 provides the necessary improvement in response time to meet the rise and fall time requirements of the modem logic circuitry which are of the order of 10 microseconds. The increased speed is achieved without increase in the low current drive to the isolator LED.

The isolators used have sufficient gain but suffer from a relatively slow response time when used in the normal configuration. This is caused by the fact that, while the optical transistor base charge is created by the light from the LED when turned on, that stored charge must be allowed to bleed off in order to turn the transistor off. If the only path for dissipation is through the high impedance base-emitter junctions the process is likely to take hundreds of microseconds. This is further compounded in normal configuration by so-called Miller effect capacitance or the collector-base capacitance of the transistor. Any large changes in voltage at the collector cause a current to flow through that spurious capacitance to the base and the current always opposes the turn-off operation. This is normally offset by adding a resistor from base to emitter to provide an alternate path for dissipating base charge. However, it is then required that the LED must be brighter (more LED drive current) to furnish the added current in the resistor while the transistor is on. The capacitance from collector to base cannot be eliminated, but it is possible to reduce by several orders of magnitude the change in collector voltage which causes the opposing current flow.

The circuit of FIG. 2 accomplishes this by providing transistor Q1 to guard the collector of the isolator from the large voltage changes necessary to transmit the logic signals. The circuit Q1, R2, R3, R4, and C1 comprise a grounded base amplifier for AC signals. When the isolator is turned on, current is furnished to the emitter of Q1. The current is passed through Q1 to the collector via resistor R2 which is of the order of 20 K ohms. A large change in Q1 collector voltage is generated by a few hundred microamps of current. Since the emitter of Q1 is a very low impedance, only a few millivolts of change in emitter voltage is necessary to generate several volts of collector voltage change. The emitter of Q1 is driven by the collector of the opto-transistor which now has only a few millivolts of change during turn-on and turn-off rather than the several volts present in the normal configuration. The "guarding" technique almost eliminates the Miller effect and improves low current operating speed by as much as a hundred fold.

The resistors R3 and R4 furnish base drive to Q1 just sufficient to maintain conduction of Q1 in the "on" state. The capacitor C1 prevents rapid changes in Q1 base voltage which would cause greater changes in the emitter voltage. A resistor R1 (typically 15 megohms) is provided in the base of this isolator but is necessary only to prevent spurious turn-on due to the capacitive coupling of common mode current when large differences in voltage exist between the LED and the photoresistor pair. For example, 150 volts at 60 Hz is commonly present on the telephone line. By using the guard circuit techniques above, the inexpensive opto-isolator can be utilized at low (1 to 2 milliamperes) LED drive levels to achieve response times less than 10 microseconds.

The invention is not to be limited by what has been shown and described except as indicated in the appended claims.

What is claimed is:

1. A telephone line powered modem comprising:
   a transmitter operative in response to binary data from a source to provide modulated data signals to the telephone lines;
   a receiver operative to provide binary data signals derived from signals received on the telephone line;
   a power source operative in response to telephone line power to provide operating power for the transmitter and receiver while maintaining the current drawn from the telephone line and the voltage drop across the telephone line within specified limits;
   output interface means including electro-optic isolators for coupling the binary data signals to be transmitted to the transmitter and for coupling the received binary data signals from the receiver to utilization equipment connected to the modem output,
   wherein said electro-optical isolators each include:
   a light emitting diode providing light signals in response to applied binary data signals;
   a phototransistor pair in light coupling relationship with the light emitting diode and providing a corresponding change in conduction in response to light signals from the light emitting diode; and
   a common base amplifier including:
   a bipolar transistor;
   a collector load connected to the collector of said bipolar transistor for developing an output signal thereacross;
   the emitter of said bipolar transistor being connected to said phototransistor which produces a change in the emitter voltage and emitter current according to change in the phototransistor conduction, said change in emitter voltage and emitter current producing a corresponding change in the transistor base current;

resistive base bias means connected to the base of said common base amplifier for providing said base current, and a bias voltage variable according to said base current determined by the phototransistor conduction in response to the received binary light pulses; and capacitor means for preventing rapid changes in the bias voltage, operative to limit rapid changes in emitter voltage necessary to produce said output signal, wherein, the resistive base bias means being selected to provide the base voltage and the corresponding emitted voltage to just maintain conduction of the common base amplifier when said photodiode is in the on condition, whereupon after said binary data causes said light signal to cease, the response time of the corresponding change of said output signal being reduced by an initially limited change in said base voltage according to the capacitor means in combination with said resistor base bias means being operative to limit rapid changes and corresponding said emitted voltage wherein the resulting change in voltage across the phototransistor is minimized.

2. The modem of claim 1 wherein said resistive base bias means comprises a resistor voltage divider.

3. The modem of claim 2 wherein:
said collector load comprises a resistance of twenty thousand ohms and said output comprises a binary signal corresponding to said binary data light pulses, wherein a few milivolts of change in emitter voltage produces a corresponding large signal change of several volts in the output signal, with a response time of less than ten microseconds.

* * * * *

UNITED STATES PATENT AND TRADEMARK OFFICE
CERTIFICATE OF CORRECTION

PATENT NO. : 4,417,099
DATED : November 22, 1983
INVENTOR(S) : O. Leon Pierce

It is certified that error appears in the above—identified patent and that said Letters Patent is hereby corrected as shown below:

Column 6, line 21, "photoresistor" should read --phototransistor--.

Column 8, line 14, "milivolts" should read --millivolts--.

Signed and Sealed this

Tenth Day of April 1984

[SEAL]

Attest:

GERALD J. MOSSINGHOFF

Attesting Officer     Commissioner of Patents and Trademarks